United States Patent
Walter

(10) Patent No.: US 9,431,572 B2
(45) Date of Patent: Aug. 30, 2016

(54) DUAL MODE TILTED-CHARGE DEVICES AND METHODS

(71) Applicant: Quantum Electro Opto Systems Sdn. Bhd., Melaka (MY)

(72) Inventor: Gabriel Walter, Madison, WI (US)

(73) Assignee: Quantum Electro Opto Systems Sdn. Bhd., Melaka (MY)

( * ) Notice: Subject to any disclaimer, the term of this patent is extended or adjusted under 35 U.S.C. 154(b) by 114 days.

(21) Appl. No.: 13/957,386

(22) Filed: Aug. 1, 2013

(65) Prior Publication Data

US 2014/0035660 A1    Feb. 6, 2014

Related U.S. Application Data

(60) Provisional application No. 61/742,082, filed on Aug. 2, 2012.

(51) Int. Cl.

| | |
|---|---|
| *H01L 29/06* | (2006.01) |
| *H01L 33/06* | (2010.01) |
| *H01L 29/737* | (2006.01) |
| *H01L 33/00* | (2010.01) |
| *H01L 29/10* | (2006.01) |
| *H01L 29/12* | (2006.01) |
| *B82Y 10/00* | (2011.01) |
| *H01L 33/04* | (2010.01) |
| *H01L 29/08* | (2006.01) |
| *H01L 29/205* | (2006.01) |

(52) U.S. Cl.
CPC ............ *H01L 33/002* (2013.01); *B82Y 10/00* (2013.01); *H01L 29/1004* (2013.01); *H01L 29/122* (2013.01); *H01L 29/7371* (2013.01); *H01L 33/06* (2013.01); *H01L 29/0817* (2013.01); *H01L 29/205* (2013.01); *H01L 33/0016* (2013.01); *H01L 33/04* (2013.01)

(58) Field of Classification Search
None
See application file for complete search history.

(56) References Cited

U.S. PATENT DOCUMENTS

| | | | |
|---|---|---|---|
| 6,727,530 B1 | 4/2004 | Feng et al. | 257/184 |
| 7,091,082 B2 | 8/2006 | Feng | 438/235 |
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,693,195 B2 | 4/2010 | Feng et al. | 372/30 |
| 7,696,536 B1 | 4/2010 | Feng et al. | 257/197 |
| 7,711,015 B2 | 5/2010 | Holonyak et al. | 372/11 |
| 7,813,396 B2 | 10/2010 | Feng et al. | 372/43.01 |

(Continued)

FOREIGN PATENT DOCUMENTS

WO    WO2010/120372    10/2010

*Primary Examiner* — Hoang-Quan Ho
(74) *Attorney, Agent, or Firm* — Martin Novack

(57) ABSTRACT

A method for providing and operating a device in a first mode as a light-emitting transistor and in a second mode as a high speed electrical transistor, including the following steps: providing a semiconductor base region of a first conductivity type between semiconductor emitter and collector regions of a second semiconductor type; providing, in the base region, a quantum size region; providing, in the base region between the quantum size region and the collector region, a carrier transition region; applying a controllable bias voltage with respect to the base and collector regions to control depletion of carriers in at least the carrier transition region; and applying signals with respect to the emitter, base, and collector regions to operate the device as either a light-emitting transistor or a high speed electrical transistor, depending on the controlled bias signal.

12 Claims, 7 Drawing Sheets

(56) References Cited

U.S. PATENT DOCUMENTS

| | | | |
|---|---|---|---|
| 7,888,199 B2 | 2/2011 | Walter et al. | 438/235 |
| 7,888,625 B2 | 2/2011 | Holonyak et al. | 250/214 |
| 7,998,807 B2 | 8/2011 | Feng et al. | 438/235 |
| 8,005,124 B2 | 8/2011 | Then et al. | 372/46.011 |
| 8,179,937 B2 | 5/2012 | Walter et al. | 372/38.05 |
| 8,179,939 B2 | 5/2012 | Holonyak et al. | 372/43.01 |
| 8,494,375 B2 | 7/2013 | Walter | 398/183 |
| 8,970,126 B2 * | 3/2015 | Feng et al. | 315/291 |
| 2005/0040387 A1 | 2/2005 | Feng et al. | 257/14 |
| 2005/0040432 A1 | 2/2005 | Feng et al. | 257/198 |
| 2005/0054172 A1 | 3/2005 | Feng | 438/313 |
| 2006/0208290 A1 | 9/2006 | Feng et al. | 257/292 |
| 2008/0089368 A1 | 4/2008 | Feng et al. | 372/25 |
| 2008/0240173 A1 | 10/2008 | Holonyak et al. | 372/9 |
| 2009/0134939 A1 | 5/2009 | Feng et al. | 327/581 |
| 2010/0034228 A1 | 2/2010 | Holonyak et al. | 374/45 |
| 2010/0073086 A1 | 3/2010 | Holonyak et al. | 330/149 |
| 2010/0085995 A1 | 4/2010 | Feng et al. | 372/43.01 |
| 2010/0103971 A1 | 4/2010 | Then et al. | 372/45.01 |
| 2010/0202483 A1 * | 8/2010 | Walter et al. | 372/45.01 |
| 2010/0202484 A1 | 8/2010 | Holonyak et al. | 372/45.01 |
| 2010/0272140 A1 | 10/2010 | Walter et al. | 372/38.02 |
| 2010/0289427 A1 * | 11/2010 | Walter et al. | 315/291 |
| 2010/0315018 A1 | 12/2010 | Then et al. | 315/291 |
| 2011/0150487 A1 | 6/2011 | Walter | 398/115 |
| 2012/0068151 A1 | 3/2012 | Walter | 257/9 |
| 2012/0068207 A1 | 3/2012 | Hata et al. | 257/94 |
| 2013/0093352 A1 * | 4/2013 | Feng et al. | 315/291 |
| 2013/0126825 A1 * | 5/2013 | Walter | 257/13 |

* cited by examiner

| Layer (Region) | Comment | SL | Material | x | Thickness (A) | Type | Dopant | Level (/cm³) |
|---|---|---|---|---|---|---|---|---|
| 16 | Sub-Emitter | | In(x)Ga(1-x)As | 0.500 | 500 | N | Te | 2.0E+19 |
| 15 | Sub-Emitter | | In(x)Ga(1-x)As | 0.0-0.5 | 500 | N | Te | 2.0E+19 |
| 14 | Sub-Emitter | | Al(x)Ga(1-x)As | 0.000 | 1200 | N | Si | 5.0E+18 |
| 13 (h) | Emitter | | In(x)Ga(1-x)P | 0.490 | 530 | N- | Si | 2.0E+17 |
| 12 (g) | | | GaAs | 0.000 | 700 | P | C | 4.0E+19 |
| 11 (g) | | | GaAs | 0.000 | 200 | P | C | 1.0E+19 |
| 10 (f) | | | GaAs | 0.000 | 150 | i | UID | 1.0E+16 |
| 9 (e) | | | InGaAs | 1000 nm | 150 | i | UID | 1.0E+16 |
| 8 (d) | | | GaAs | 0.000 | 50 | i | UID | 1.0E+16 |
| 7 (c) | | | GaAs | 0.000 | 100 | P | C | 1.0E+18 |
| 6 (c) | | | GaAs | 0.000 | 200 | P | C | 2.5E+18 |
| 5 (b) | Collector | | Al(x)Ga(1-x)As | 0.000 | 3000 | I | UID | 1.0E+16 |
| 4 (b) | Ordered | | In(x)Ga(1-x)P | 0.490 | 120 | N- | Si | 2.0E+17 |
| 3 (a) | Sub-Collector | | GaAs | | 5500 | N | Si | 5.0E+18 |
| 2 | Ordered | | In(x)Ga(1-x)P | 0.490 | 120 | N- | Si | 2.0E+17 |
| 1 | Buffer | | GaAs | | 500 | UID | UID | UID |
| | Substrate | | 4" GaAs | | | SI (US) | | |

FIG. 4

| Layer | Comment | SL | Material | x | Thickness (A) | | Type | Dopant | Level (/cm³) |
|---|---|---|---|---|---|---|---|---|---|
| 16 | Sub-Emitter | | In(x)Ga(1-x)As | 0.500 | 500 | | N | Te | 2.0E+19 |
| 15 | Sub-Emitter | | In(x)Ga(1-x)As | 0.0-0.5 | 500 | | N | Te | 2.0E+19 |
| 14 | Sub-Emitter | | Al(x)Ga(1-x)As | 0.000 | 1200 | | N | Si | 5.0E+18 |
| 13 (h) | Emitter | | In(x)Ga(1-x)P | 0.490 | 530 | | N- | Si | 2.0E+17 |
| 12 (g) | | | GaAs | 0.000 | 700 | | P | C | 4.0E+19 |
| 11 (g) | | | GaAs | 0.000 | 200 | | P | C | 1.0E+19 |
| 10 (f) | | | GaAs | 0.000 | 150 | | i | UID | 1.0E+16 |
| 9 (e) | | | InGaAs | 1000 nm | 150 | | i | UID | 1.0E+16 |
| 8 (d) | | | GaAs | 0.000 | 50 | | i | UID | 1.0E+16 |
| 7 (c) | | | Al(x)Ga(1-x)As | 0.150 | 100 | | P | C | 1.0E+18 |
| 6 (c) | | | Al(x)Ga(1-x)As | 0.150 | 200 | | P | C | 2.5E+18 |
| 5 (b) | Collector | | Al(x)Ga(1-x)As | 0.000 | 3000 | | I | UID | 1.0E+16 |
| 4 (b) | Ordered | | In(x)Ga(1-x)P | 0.490 | 120 | | N- | Si | 2.0E+17 |
| 3 (a) | Sub-Collector | | GaAs | | 5500 | | N | Si | 5.0E+18 |
| 2 | Ordered | | In(x)Ga(1-x)P | 0.490 | 120 | | N- | Si | 2.0E+17 |
| 1 | Buffer | | GaAs | | 500 | | UID | UID | UID |
| | Substrate | | 4" GaAs | | | | SI (US) | | |

FIG. 8

DUAL MODE TILTED-CHARGE DEVICES AND METHODS

PRIORITY CLAIM

Priority is claimed from U.S. Provisional Patent Application No. 61/742,082, filed Aug. 2, 2012, and said Provisional Patent Application is incorporated herein by reference.

FIELD OF THE INVENTION

This invention relates to the field of semiconductor devices and methods and, more particularly, to tilted charge devices and methods exhibiting improved dual mode attributes for optical and electrical operation.

BACKGROUND OF THE INVENTION

Included in the background of the present invention are technologies relating to heterojunction bipolar transistors (HBTs, which are electrical tilted-charge devices) and light-emitting transistors, transistor lasers, and tilted-charge light-emitting diodes (respectively, LETs, TLs, and TCLEDs, all of which are optical tilted-charge devices). A tilted-charge device gets its name from the energy diagram characteristic in the device's base region, which has, approximately, a descending ramp shape from the emitter interface to the collector (or drain, for a two terminal device) interface. This represents a tilted-charge population of carriers that are in dynamic flow—"fast" carriers recombine, and "slow" carriers exit via the collector (or drain).

Regarding optical-tilted charge devices and techniques, which typically employ one or more quantum size regions in the device's base region, reference can be made, for example, to U.S. Pat. Nos. 7,091,082, 7,286,583, 7,354,780, 7,535,034, 7,693,195, 7,696,536, 7,711,015, 7,813,396, 7,888,199, 7,888,625, 7,953,133, 7,998,807, 8,005,124, 8,179,937, 8,179,939, and 8,494,375; to U.S. Patent Application Publication Numbers US2005/0040432, US2005/0054172, US2008/0240173, US2009/0134939, US2010/0034228, US2010/0202483, US2010/0202484, US2010/0272140, US2010/0289427, US2011/0150487, and US2012/0068151; and to PCT International Patent Publication Numbers WO/2005/020287 and WO/2006/093883, as well as to the publications referenced in U.S. Patent Application Publication Number US2012/0068151.

Applicant has considered the effects of quantum wells in the base region of a high speed electrical tilted-charge device (HS-ETCD), such as a high speed heterojunction bipolar transistor (HBT). An experimental study indicated that a large amount of minority carrier charge is stored within the quantum well region of the device. The increased charge storage in the base region containing the quantum well then resulted in a lower cutoff frequency ($f_t$) and a lower electrical gain-bandwidth product.

For example, in FIG. 2 characteristics of two high speed devices are compared. The first device is a traditional high speed electrical device, in this example a high speed electrical tilted-charge device, such as the heterojunction bipolar transistor (HBT) shown in FIG. 1. In the example of the FIG. 1 device, the layers are III-V semiconductor materials including an undoped substrate 110, an n-type sub-collector layer 120, an n-type collector layer 130, a p-type base layer 140, and an n-type emitter layer 150. Metal contacts shown at 131, 141 and 151 comprise the collector, base, and emitter electrodes, respectively, and the potentials at these electrodes are designated $V_C$, $V_B$, and $V_E$, respectively. An example of DC bias range conditions is $V_{BE} > 1.2$ volts and $-2.5 \text{ volts} < V_{BC} < 0.5 \text{ volts}$.

The second device of this example is similar, except for the presence of two quantum wells (not shown) embedded in the base region of the device. The second device will have enhanced carrier recombination in the quantum wells of the base region. Both devices of the example have emitter mesa dimensions of 4.2 um by 7.4 um, and were biased with the same emitter current of 4 mA.

FIG. 2 shows a plot of current gain as a function of frequency for the two devices. The cutoff frequency ($f_c$) is defined as the frequency where the ac current gain ($\beta_{ac} = I_C/I_B$) equals 1. For this example, the high speed electrical tilted-charge device (HS-ETCD) with no quantum well has a cutoff frequency ($f_t$) of 10.4 GHz and a 3 dB frequency of 0.24 GHz. On the other hand, the high speed optical tilted charge device (HS-OTCD) containing two quantum wells embedded in the base region has an $f_t$ of only 1.3 GHz and of 3 dB frequency of 0.42 GHz. The large reduction of the cutoff frequency, $f_t$, for the high speed optical tilted charge device (HS-OTCD) makes the device unsuitable for most electrical applications traditionally associated with an HS-ETCD (e.g. drivers, amplifiers, or oscillators). Furthermore, the electrical gain-bandwidth product of an HS-OTCD is substantially temperature dependent due to quantum well re-thermalization effects.

FIG. 3 shows the optical bandwidth cutoff ($f_{oc}$) of the high speed optical tilted charge device (HS-OTCD). The optical bandwidth cutoff ($f_{oc}$) is defined as the frequency where the optical power to detector power sensitivity ratio is 1. As indicated, the corresponding HS-OTCD above has an optical bandwidth cutoff ($f_{oc}$) of ~10 GHz despite having an electrical cutoff frequency of only 1.3 GHz.

It is accordingly evident that the potential use of a high speed tilted-charge device as both an optical device and an electrical device is substantially limited by the effects described above. It is among the objects hereof to address these limitations of the prior art and to set forth devices and techniques for dual mode operation of high speed tilted-charge devices such as light-emitting transistors.

SUMMARY OF THE INVENTION

The invention includes techniques and devices for selectively reducing or eliminating quantum well charge storage, reducing temperature dependencies, and increasing recombination events in tilted-charge devices.

In accordance with a form of the invention, a method is set forth for providing and operating a device in a first mode as a light-emitting transistor and in a second mode as a high speed electrical transistor, including the following steps: providing a semiconductor base region of a first conductivity type between semiconductor emitter and collector regions of a second semiconductor type; providing, in said base region, a quantum size region; providing, in said base region between said quantum size region and said collector region, a carrier transition region; applying a controllable bias voltage with respect to said base and collector regions to control depletion of carriers in at least said carrier transition region; and applying signals with respect to said emitter, base, and collector regions to operate said device as either a light-emitting transistor or a high speed electrical transistor, depending on said controlled bias signal.

In an embodiment of the invention, the step of applying said controllable bias signal comprises applying a controllable bias voltage across the junction of said base and collector regions. The application of the controllable bias voltage comprises applying said bias voltage to fully deplete carriers in said collector region, said carrier transition region, and a portion of said base region, for operation of said device as a high speed electrical transistor. The depleted portion of said base region includes said quantum size region and the part of said base region between said quantum size region and said carrier transition region.

In an embodiment of the invention, the step of providing said base region comprises providing a GaAs base region doped p-type and having a quantum well, and said step of providing said carrier transition region comprises providing a GaAs region doped less heavily p-type than the portion of said base region between said quantum well and said emitter region.

In another embodiment of the invention, the step of providing said base region comprises providing a GaAs base region doped p-type and having a quantum well, and said step of providing said carrier transition region comprises providing a region of semiconductor material having wider bandgap than GaAs and being doped p-type. In a disclosed form of this embodiment, the carrier transition region comprises a region of p-type AlGaAs.

Further features and advantages of the invention will become more readily apparent from the following detailed description when taken in conjunction with the accompanying drawings.

BRIEF DESCRIPTION OF THE DRAWINGS

FIG. 4 is a table showing the epilayer structure of an embodiment of an HS-OTCD with a voltage coupling mechanism (region (c)). The epilayers are designed so that layers 4 through 10 are completely depleted when a reverse bias voltage of −0.5V is applied across the base-collector junction, thus effectively shifting the quantum well from the base region into the collector region. This allows the HS-OTCD to switch operation into a HS-ETCD (higher current gain and $f_t$).

FIG. 6 shows operation of the dual mode device with the device operated as an HS-OTCD. The large lateral arrow signifies the large recombination current (and dominantly optical recombination) in the QW region and also the lateral distribution of recombination current. The smaller arrows signify the typical minority carrier recombination in a the p-type base region. FIG. 7 shows operation of the dual mode device with the device operated as an HS-ETCD.

FIG. 8 is a table showing the epilayer structure of an embodiment of an a HS-OTCD with a modified coupling mechanism (layers 6 and 7) that functions to force the capture of electrons by the quantum structure and improves temperature stability. The device is also capable of switching operation from HS-OTCD to HS-ETCD with the appropriate base-collector reverse bias applied.

DETAILED DESCRIPTION

Figure 1:
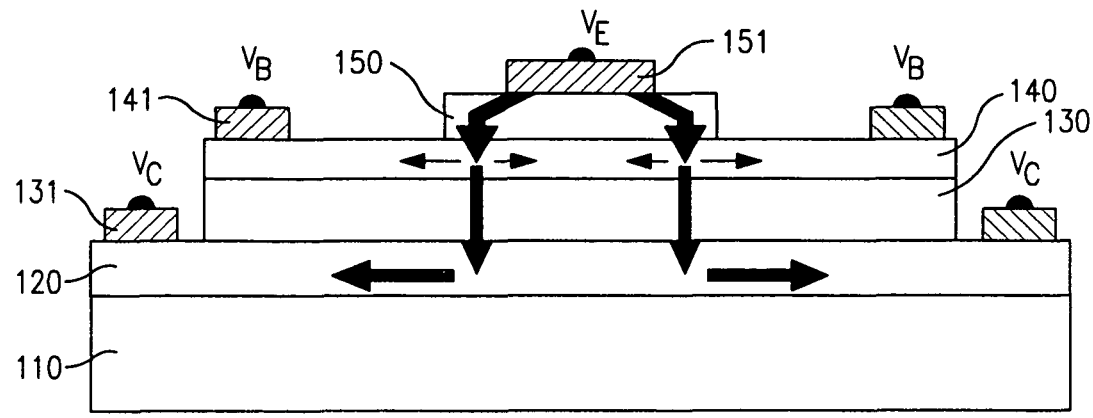
FIG. 1 is a simplified cross-sectional diagram (not to scale) of a prior art high speed electrical tilted-charge device (HS-ETCD) in the form of a heterojunction bipolar transistor (HBT). The arrows generally depict carrier flow.

In prior art high speed optical tilted-charge devices (HS-OTCDs), captured minority carriers in the quantum well (QW) of the device exit via two pathways; (i) electron-hole pair recombination ($\tau_r$) in the QW, and (ii) re-thermalization out of the QW ($\tau_{th}$). In accordance with a feature hereof, an exit pathway for the trapped (stored) minority carriers is introduced where captured electrons in the quantum well are coupled directly to the electrical collector of the device. The coupling strength is controlled by application of external voltages to the base-collector junction. In an embodiment hereof, this coupling mechanism is achieved using a voltage tunable, partially depleted p-type portion of the base region (region (c) in FIG. 4) that is incorporated by adjusting the total dopant in that region. When an external voltage is applied across the base-collector junction, the coupling mechanism reacts by reducing or increasing the coupling distance ($W_{VT}$, as shown in FIG. 5), and therefore allowing the QW well energy states to be more coupled or less coupled into the continuum states of the depletion region. Stronger coupling between the energy states of the two regions reduces the transit time of electrons from within the quantum well into the depletion region of the electrical collector ($\tau_{tu}$).

The epilayers of an embodiment of the invention are shown in the table of FIG. 4. The built-in voltage potential as a result of the P-N junction formed by p-type GaAs region (c) (layers 6 and 7) and n-type GaAs region (a) (layer 3) depletes the 300 nm undoped GaAs layer (layer 5) and 12 nm InGaP etch stop (layer 4) of region (b). In addition to that, the depletion region also extends into ~17 nm of layer 3 of region (a). Region (c) is designed so that layer 6 is completely depleted and layer 7 is partially depleted when no external bias is applied. Layer 7 of region (c), which has a p-doping concentration of $1 \times 10^{18}$ cm$^{-3}$, is deliberately designed to have lower doping concentration than the n-type doping concentrations of layer 3 (Nd=$5 \times 10^{18}$ cm$^{-3}$) of region (a).

The total depletion width ($W_{PN}$) into the P and N regions is given by the following relationship (Eq. 1):

$$W_{PN} = \left[ \frac{2\varepsilon(V_{bi} - V_{ext})}{q} \left( \frac{N_a + N_d}{N_a N_d} \right) \right]^{\frac{1}{2}}$$

The total depletion width into the P-type region (c) ($X_{Rc}$) is given by the following relationship (Eq. 2)

$$X_{RC} = \frac{N_d}{N_a + N_d} W_{PN}$$

When an external bias ($V_{ext}$) is applied to expand or contract (see Eq. 1) the PN region depletion width ($W_{PN}$), the relatively lower doping of the region (c) will force the expansion or contraction to occur mainly in region (c) (see Eq. 2).

Figure 5A:
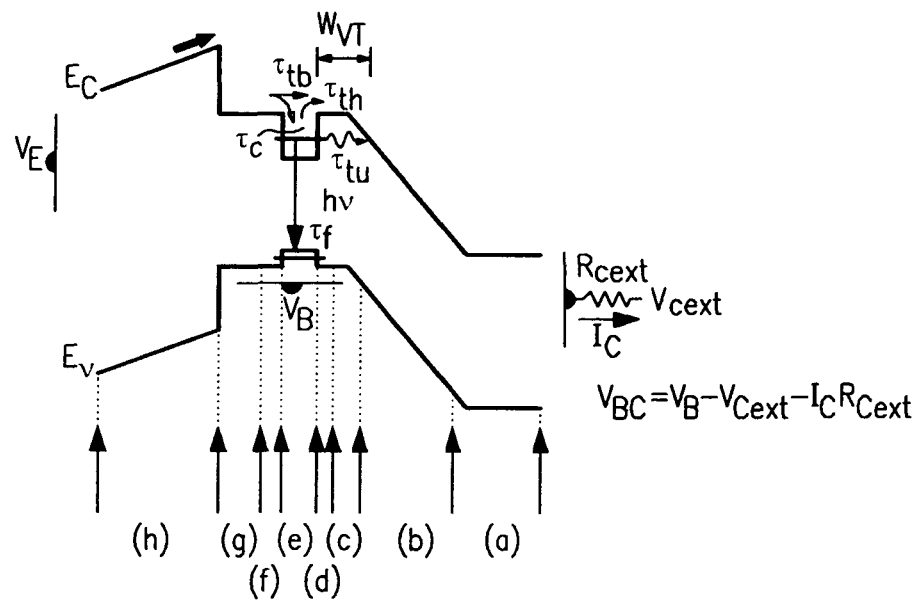
FIG. 5A is an energy diagram of the HS-OTCD of the FIG. 4 embodiment. The voltage controlled coupling mechanism is at region (c). The coupling strength is varied by the application of external bias ($V_{ext}$) that changes the coupling distance ($W_{VT}$). Control of the coupling distance can be achieved, for example, by the use of an external resistor that is coupled to the collector contact.

FIG. 5A is an energy diagram of the HS-OTCD of the FIG. 4 embodiment. As explained, the voltage controlled coupling mechanism is at region (c). As indicated, the coupling strength is varied by the application of external bias ($V_{ext}$) that changes the coupling distance ($W_{VT}$). Control of the coupling distance can be achieved, for example, by the use of an external resistor that is coupled to the collector contact. The use of multiple quantum structures can be used to reduce capture time.

As described, in order for a high speed optical tilted-charge device (HS-OTCD) to function as a practical high speed electrical tilted-charge device (HS-ETCD) the previously described quantum structure effects (charge storage and re-thermalization) must be removed from the device's base region. In a further embodiment of the invention, the quantum well effects are substantially eliminated by enabling the HS-OTCD to switch into a HS-ETCD when operated in full depletion mode.

Figure 5B:
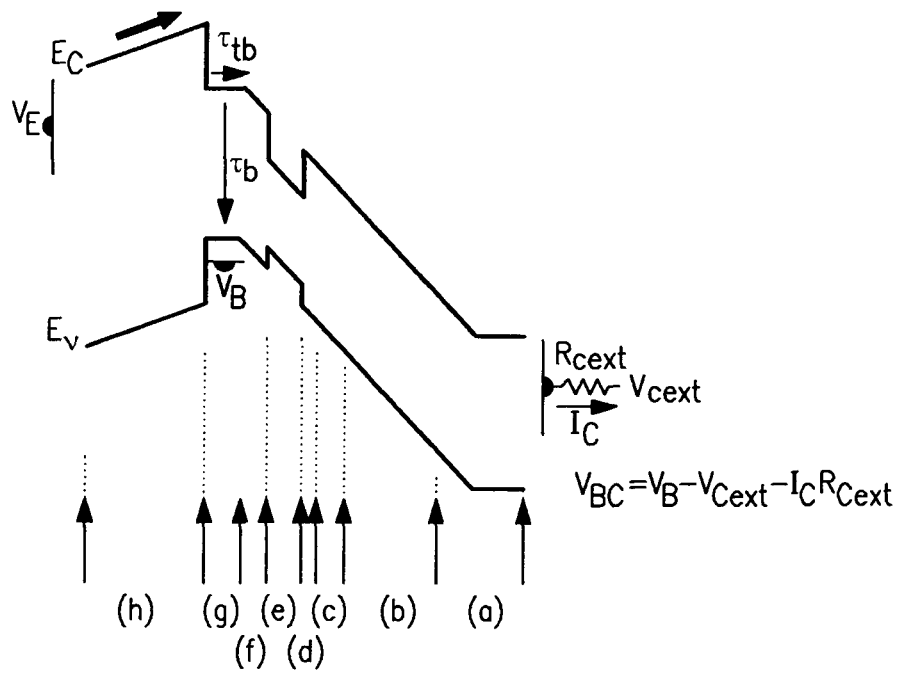
FIG. 5B is an energy diagram of an HS-OTCD operating in full depletion mode as a HS-ETCD. In this mode, the quantum structure is fully depleted by the applied electric field and now resides in the electrical collector region.

In full depletion mode, the coupling mechanism (region (c)) is fully depleted and the depletion region is extended to the boundary of region (g) (see energy diagram of FIG. 5B). For the design shown in FIG. 4, the depletion mode is achieved by the application of a small base-collector voltage ($V_{BC}$) of less than −0.5 V.

Figure 2:
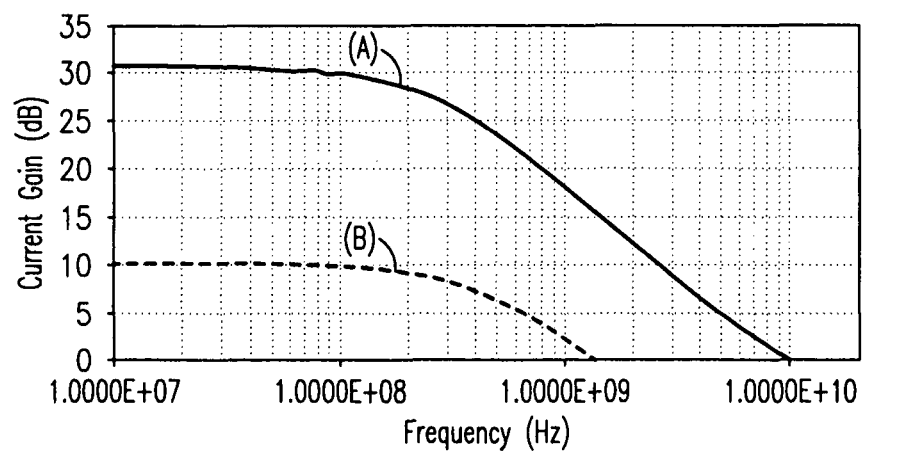
FIG. 2 shows a plot of current gain as a function of frequency for the device of FIG. 1 and also for a second device that is similar except for the presence of two quantum wells embedded in the base region thereof.
Figure 3:
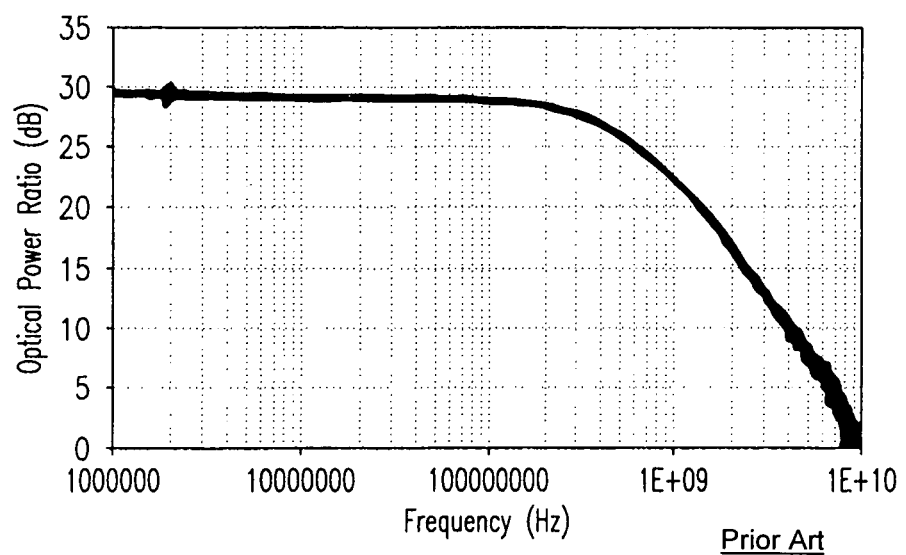
FIG. 3 shows the optical bandwidth cutoff ($f_{oc}$) of the devices of the example of FIGS. 1 and 2. The optical bandwidth cutoff ($f_{oc}$) is defined as the frequency where the optical power to detector power sensitivity ratio is 1.

Under this mode, the quantum well now resides in the depletion region (electrical collector) and is fully depleted of holes (no recombination process). Any captured electrons in this depleted quantum well are swept out the applied electric field, preventing significant charge build-up in the quantum structure. The effect of the quantum structure to the collector transit time is therefore negligible. The base recombination is now governed only by bulk recombination in the base region and the effective base width is narrowed from about 155 nm to 90 nm. This base narrowing effect will result in higher ac current gain ($\beta_{ac}$) and also improved $f_t$ due to reduction base transit time and base charge storage. The ac current gain frequency response changes as the device is switched from HS-OTCD to HS-ETCD and is substantially similar to the response curves first shown in FIG. 2.

In the embodiment of FIG. 4, the epilayers are also designed such that the conduction of holes is supported dominantly by region (g). This is to ensure that the base sheet resistance does not degrade due to base narrowing effects. For example, the 155 nm p-type base region has a designed sheet resistance of 223.2 Ohm/square when operated as a HS-OTCD. However, when operated in full depletion mode where the base width is reduced to 90 nm, the base sheet resistance exhibits negligible change to 223.9 Ohm/square (0.3% change).

In accordance with a further feature hereof, the coupling mechanism may also be designed so that the default operation (at $V_{bc}$=0) of the tilted-charge device is already in full depletion mode (HS-ETCD operation). Switching from HS-ETCD to HS-OTCD is then achieved by application of base collector voltage that is relatively more positive ($V_{bc}$>0).

Figure 6:
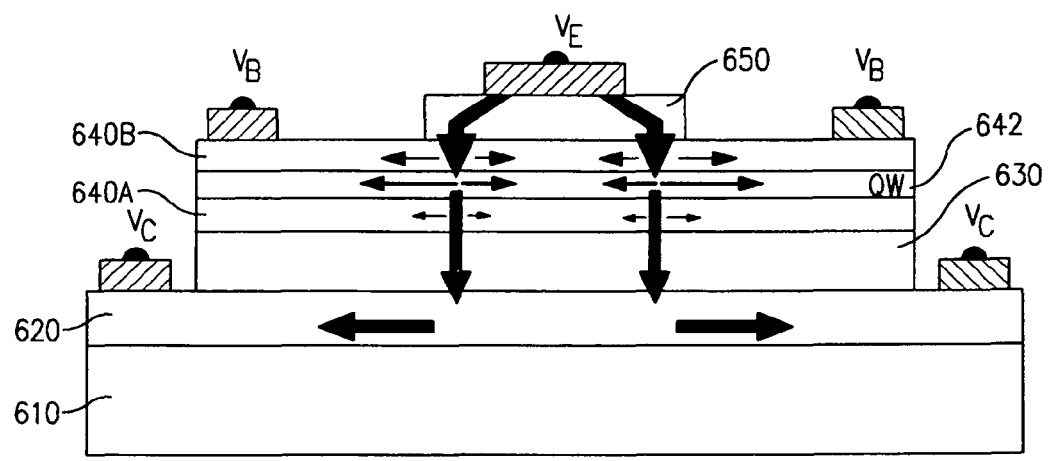
FIGS. 6 and 7 are simplified cross-sectional diagrams (not to scale) that illustrate modes of operation of an embodiment of the invention.
Figure 7:
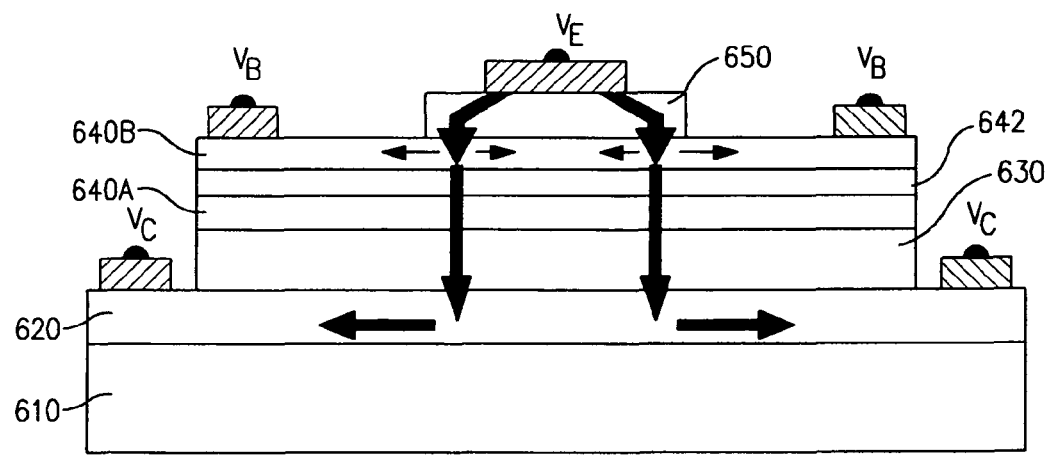

The simplified diagrams of FIGS. 6 and 7 further illustrate the described operation. The regions shown in these Figures include substrate 610, subcollector region 620, collector region 630, base region portions 640A and 640B with one or more quantum wells 642, and emitter region 650. The lower portion of the base region (640A) includes the coupling region (e.g. region (c) of the FIG. 4 table—not separately shown in FIGS. 6 and 7) that is adjacent the collector region. FIG. 6 illustrates operation as a high speed optical tilted-charge device (HS-OTCD), in this case a light-emitting transistor. An example of DC bias range conditions is $V_{BE}$>1.2 volts and −0.5 volts<$V_{BC}$<0.5 volts. The large lateral arrows in the QW region signifies the large recombination current (and dominant optical recombination) and also the lateral distribution of recombination current. The smaller arrows in the base region signify the typical minority carrier recombination in a p-type region.

FIG. 7 illustrates operation as a high speed electrical tilted-charge device. As described above, in this mode an exit pathway is provided for the trapped (stored) minority carriers, so captured electrons in the quantum well are coupled directly to the electrical collector of the device. The quantum well effects are reduced or eliminated and much faster operation results.

In the prior art, emitted electrons from the emitter of a HS-OTCD exit the base region via several routes. Electrons that are not captured by the quantum well diffuse across the base region (base transit time, $\tau_b$) with minimal recombination in the base bulk region. Electrons that were captured, then either recombine or re-thermalize out of the quantum well, followed by diffusion into the electrical collector.

Figure 9:
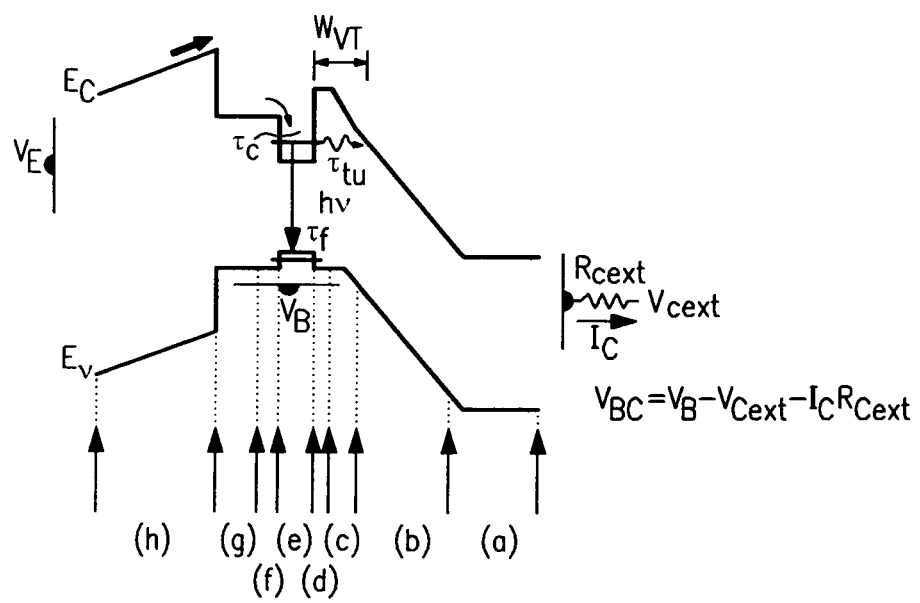
FIG. 9 is an energy diagram of an HS-OCTD as in FIG. 8 with a modified coupling mechanism. The wider bandgap coupling mechanism forces the capture of electrons into the quantum structure and prevents the re-thermalization of captured electrons towards the electrical collector. Electrons then exit via recombination or the voltage controlled coupling mechanism.

In an embodiment hereof, two exit pathways (diffusion to collector and re-thermalization) are substantially reduced by modifying the described coupling mechanism. Reference can be made to the epilayer structure in the table of FIG. 8 and the energy diagram of FIG. 9. A material with larger conduction band energy relative to region (g) can be used in region (c) (see FIG. 8, layers 6 and 7). For example, when GaAs is replaced by AlGaAs, the conduction band energy is increased by about 187 meV. The larger bandgap functions to substantially reduce re-thermalization towards the collector. This in turn reduces the temperature dependencies of the device. Also, the energy barrier blocks the diffusion of carriers across the base into the collector with intention of forcing the capture of electrons by the quantum structure (optical collector). Captured carriers in the quantum well then recombine or are coupled via the voltage controlled coupling mechanism into the electrical collector. Therefore, the energy barrier re-routes the path of the emitted electrons so that most of the emitted electrons exit the base via the optical collector.

The invention claimed is:

1. A method for providing and operating a device in a first mode as a light-emitting transistor and in a second mode as a high speed electrical transistor, comprising the steps of:
   providing a p-type semiconductor base region between n-type semiconductor emitter and collector regions;
   providing, in said base region, a quantum size region;
   providing, in said base region between said quantum size region and said collector region, a p-type carrier transition region, said base region being more heavily doped p-type adjacent said emitter region than it is doped p-type in said carrier transition region;

applying a controllable bias voltage with respect to said base and collector regions to control depletion of carriers in at least said carrier transition region; and applying signals with respect to said emitter, base, and collector regions to operate said device as either a light-emitting transistor or a high speed electrical transistor, depending on said controllable bias voltage.

2. The method as defined by claim 1, wherein said step of applying said controllable bias voltage comprises applying a controllable bias voltage across the junction of said base and collector regions.

3. The method as defined by claim 2, wherein said step of applying said controllable bias voltage comprises applying said bias voltage to fully deplete carriers in said collector region, said carrier transition region, and a portion of said base region, for operation of said device as a high speed electrical transistor.

4. The method as defined by claim 3, wherein said applying of said bias voltage is operative to shift said quantum size region into said depleted collector region.

5. The method as defined by claim 3, wherein said depleted portion of said base region includes said quantum size region and a part of said base region between said quantum size region and said carrier transition region.

6. The method as defined by claim 3, further comprising removing said bias voltage for operation of said device as a light-emitting transistor producing light emission from said base region.

7. The method as defined by claim 6, further comprising enclosing said base region in an optical resonant cavity, whereby said light emission from said base region comprises laser emission.

8. The method as defined by claim 3, wherein said portion of said base region includes said quantum size region.

9. The method as defined by claim 3, wherein said step of providing, in said base region, a quantum size region comprises providing, in said base region, at least one quantum well.

10. A method for providing and operating a device in a first mode as a light-emitting transistor and in a second mode as a high speed electrical transistor, comprising the steps of:

providing a p-type GaAs semiconductor base region between n-type semiconductor emitter and collector regions;

providing a quantum well in said base region;

providing, in said base region between said quantum well and said collector region, a carrier transition region, said carrier transition region being GaAs doped less heavily p-type than the portion of said base region between said quantum well and said quantum well and said emitter region;

applying a controllable bias voltage across the junction of said base and collector regions to control depletion of carriers in at least said carrier transition region; and applying signals with respect to said emitter, base, and collector regions to operate said device as either a light-emitting transistor or a high speed electrical transistor, depending on said controllable bias voltage;

said step of applying said controllable bias voltage comprising applying said bias voltage to fully deplete carriers in said collector region, said carrier transition region, and a portion of said base region, for operation of said device as a high speed electrical transistor, the removal of said bias voltage resulting in operation of said device as a light-emitting transistor producing light emission from said base region.

11. A method for providing and operating a device in a first mode as a light-emitting transistor and in a second mode as a high speed electrical transistor, comprising the steps of:

providing a p-type GaAs semiconductor base region between n-type semiconductor emitter and collector regions;

providing a quantum well in said base region;

providing, in said base region between said quantum well and said collector region, a p-type carrier transition region of semiconductor material having a wider bandgap than GaAs;

applying a controllable bias voltage across the junction of said base and collector regions to control depletion of carriers in at least said carrier transition region; and applying signals with respect to said emitter, base, and collector regions to operate said device as either a light-emitting transistor or a high speed electrical transistor, depending on said controllable bias voltage;

said step of applying said controllable bias voltage comprising applying said bias voltage to fully deplete carriers in said collector region, said carrier transition region, and a portion of said base region, for operation of said device as a high speed electrical transistor, the removal of said bias voltage resulting in operation of said device as a light-emitting transistor producing light emission from said base region.

12. The method as defined by claim 11, wherein said step of providing said carrier transition region comprises providing a region of AlGaAs.

* * * * *